United States Patent [19]
Abel et al.

[11] 3,943,349
[45] Mar. 9, 1976

[54] METHOD AND DEVICE FOR RECORDING, IN REAL TIME, NON UNIFORMLY VARIABLE DATA WITH COMPRESSION OF DATA DURING PERIODS OF RELATIVELY SLOW VARIATION THEREOF

[75] Inventors: Patrice Abel; Pierre Duverne; Jean-Bernard Elziere; Jérôme Verchere de Reffye, all of Paris, France

[73] Assignee: Electricite de France, Paris, France

[22] Filed: May 28, 1974

[21] Appl. No.: 473,705

[30] Foreign Application Priority Data
May 29, 1973  France .............................. 73.19565

[52] U.S. Cl............................ 235/154; 340/347 DD
[51] Int. Cl.² .............................................. G06F 5/00
[58] Field of Search... 235/154; 340/347 DD, 172.5; 179/15 AU; 178/DIG. 3

[56] References Cited
UNITED STATES PATENTS

| | | |
|---|---|---|
| 3,185,823 | 5/1965 | Ellersick, Jr. et al................ 235/154 |
| 3,213,268 | 10/1965 | Ellersick, Jr......................... 235/154 |
| 3,490,690 | 1/1970 | Apple et al. ......................... 235/154 |
| 3,641,506 | 2/1972 | Cupp et al. ....................... 340/172.5 |
| 3,726,993 | 4/1973 | Lavallee........................ 340/347 DD |

Primary Examiner—David H. Malzahn
Attorney, Agent, or Firm—Ostrolenk, Faber, Gerb & Soffen

[57] ABSTRACT

The data is stored in the digital mode. The device comprises a sampler and converter from the analogue to the digital mode, a first set or cascade of shift registers for data, a computing and comparison unit with switching means, a second set or cascade of shift registers for the time intervals, addition units adding one digit (+ 1), subtraction units, a logical unit with control units, and a memory or storing unit. The device may be used in a high voltage station for monitoring an electrical network to detect possible faults.

9 Claims, 6 Drawing Figures

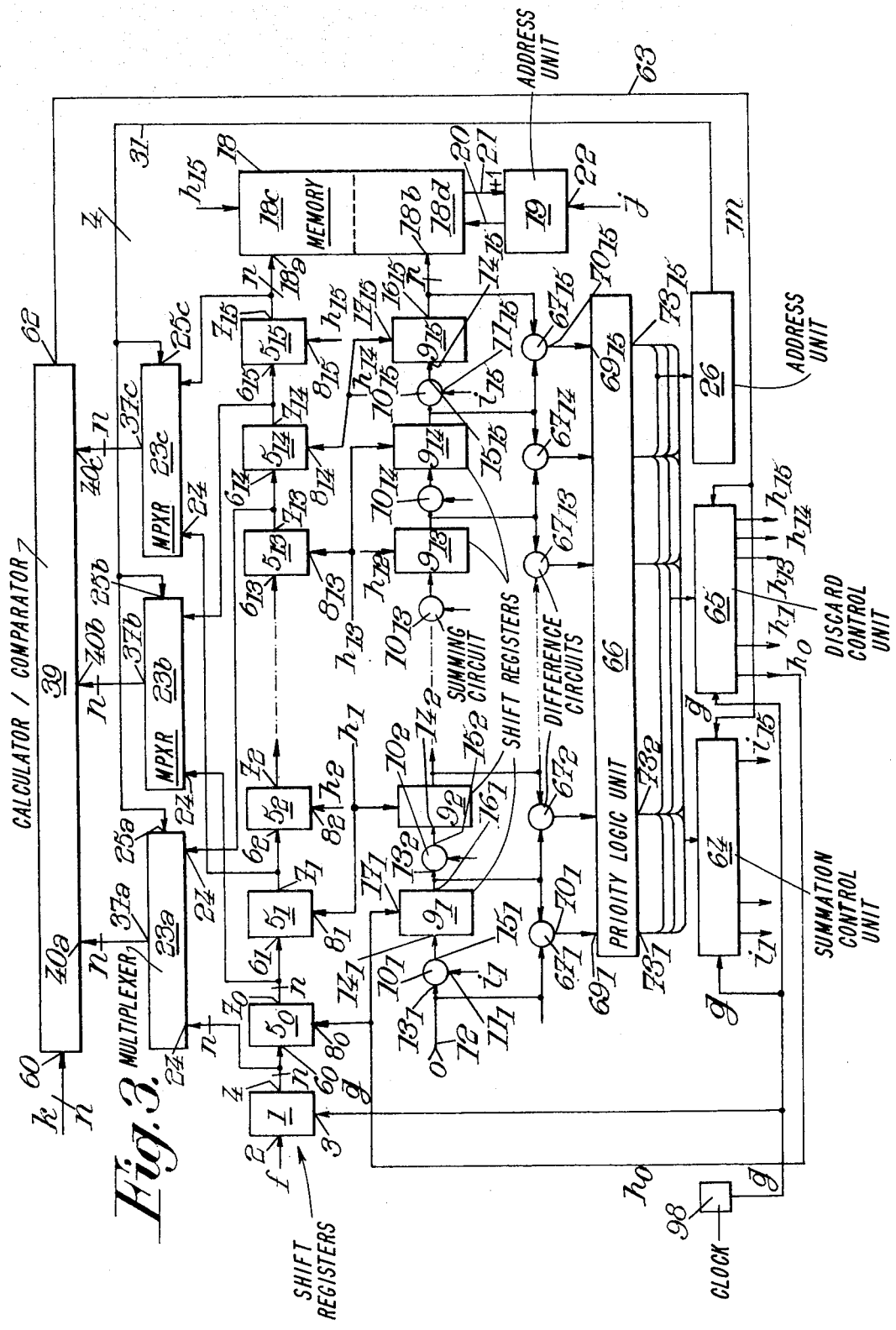

ical example.

METHOD AND DEVICE FOR RECORDING, IN REAL TIME, NON UNIFORMLY VARIABLE DATA WITH COMPRESSION OF DATA DURING PERIODS OF RELATIVELY SLOW VARIATION THEREOF

The object of this invention, is to provide a method and a device for recording, in real time, non uniformly varying data with compression of data during periods of relatively slow variation thereof.

Already known are data recording methods and devices which store, in digital form, data representing a variable phenomenon, the variation of which is produced at variable frequency, for example when it is a matter of both a permanent process (or operation) and a transient process (or operation).

In this case, it is necessary, if it is wished to avoid making use of a very big storage capacity, to proceed with the compression of data during periods when the phenomenon under study varies slowly with respect to time.

For example, the "fan" method is known. In this method, the frequency with which the sampled data is stored, follows a very complex law, which makes it difficult to code the instants of sampling, at the same time involving material errors between the compressed signal which is stored, and the original signal which corresponds to the phenomenon under study.

It was also suggested to carry out the recording at a slow rate for the permanent process and at a very high rate for the transient process, but problems arose concerning the transfer from one rate to the other and the synchronization between the recording and the phenomenon.

The storing of data on a magnetic record in analog form was also used but such a method requires a very wide pass band, and therefore, in the corresponding device, a very high tape speed of the magnetic recording carrier (tape or disk) relatively to the magnetic recorder heads which limits the duration of the phenomenon being stored unless very cumbersome mechanisms and carriers are used. Such a magnetic record also needs high precision rotary devices to be used and generally has to be operated in a controlled environment.

The object of this invention is to provide a method and a device which allows an efficient compression, and therefore a smaller storage capacity for the recording of a relatively long phenomenon, with a small error between the reproduced signal from the recording and the original signal produced by the phenomenon under study.

The method, according to the invention, for recording, in real time, non uniformly variable data, with the compression of data during periods of relatively slow variation thereof, is characterized by the fact that it comprises in combination, on the one hand, the following successive operations:
constant rate sampling of data in digital form;
storing the sampled data in the form of a series with a determined number of successive sampled data;
studying, during normal functioning of a set of three successive data stored from that series to check if the difference between the centre data of this set of three and the arithmetic mean of the two extreme data thereof is superior or inferior, in absolute value, to a given limit;

performing in response to said checking, of one or the other of these two operations: the first, which is carried out if the aforesaid difference is inferior, in absolute value, to the said limit, consists in suppressing the centre data of the set of three and to increment by one row in the series all the data which come after the suppressed middle data, the second, which is carried out if the difference is superior, in absolute value, to said limit, consists in memorizing the oldest data of the series by incrementing by one row all the stored data of the series of data;

storing a sampled data in the most recent row of storage which has just been vacated by the forward movement of part or all of the data already stored; and on the other hand, in parallel with the preceding operations of storing, studying forward movement and memorizing of successive data, the successive operations of storing and memorizing the time intervals separating the effectively stored, and then momorized data.

A device, also according to the invention, for embodying said method comprises, in combination:

a constant rate sampler for data in digital form;

a first cascade set of shift registers, the input of the first register of this stage being connected to the output of the sampler, for the storing of sampled data;

a calculator and comparator unit, with three data inputs, designed to differentiate between the signal on its second input and the arithmetic mean of the signals on the first and third inputs and to compare the absolute value of this difference with a limit value applied in the form of a signal on a fourth input;

switching means, the inputs of which are connected to the outputs of the shift registers of the first set and which is designed to switch to their three outputs, which are connected to the three inputs of the comparator unit, three consecutive outputs chosen from among the outputs of the aforesaid registers;

a second cascade set of shift registers, the number of which is equal to the number of registers of the first set less one unit, for recording the time intervals between data stored in the registers of the first set;

adder units to add one unit to the signal applied on its input, connected between the successive registers of the second set of registers as well as being upstream the first register of this set;

subtracter units to subtract the value of the input of the adder unit preceding it from the value of the output of the registers of the second state;

a logic unit, the inputs of which are connected to the outputs of the aforesaid subtractor units and which determines the three successive registers of the first stage the outputs of which will be connected through said switching means to the calculator and comparator unit;

a control unit transmitting the decisions of the logic unit to the switching means to the registers of the first and second sets and to the adder units; and a storing or memory unit with one part, the input of which is connected to the output of the last register of the first set, and a second part, the input of which is connected to the output of the last register of the second set.

The invention will be better understood with the help of the following detailed description as well as with the help of the attached drawings, both given mainly as an illustrative example.

FIG. 3 is a block diagram of the whole of the device of the invention, using the method of the invention.

Figure 6:
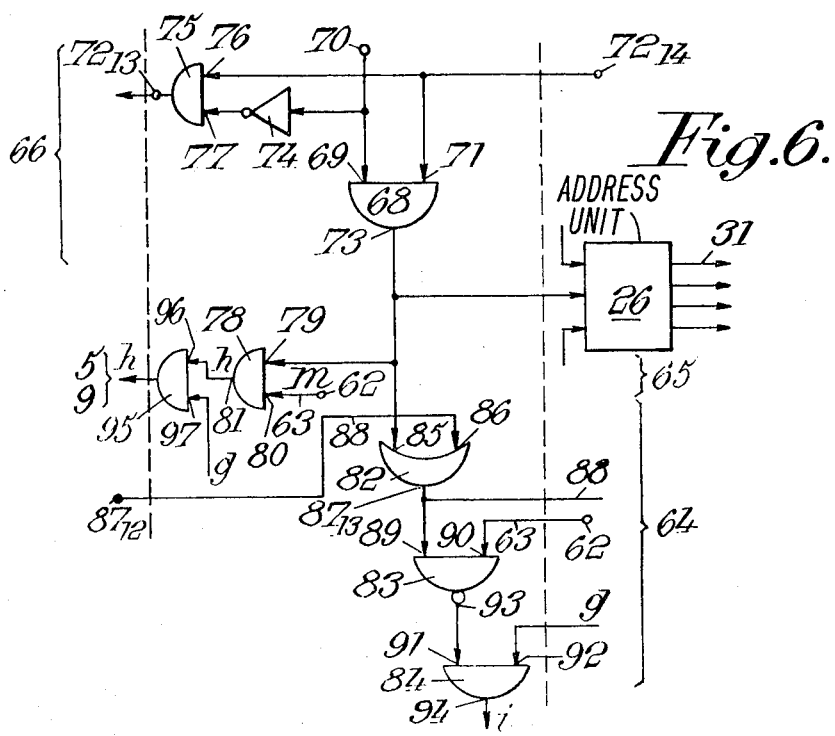

FIG. 6, finally, gives an outline of a cell of the logic unit of the device, illustrated in FIG. 3, and the associated cell of the control unit.

Figure 1:
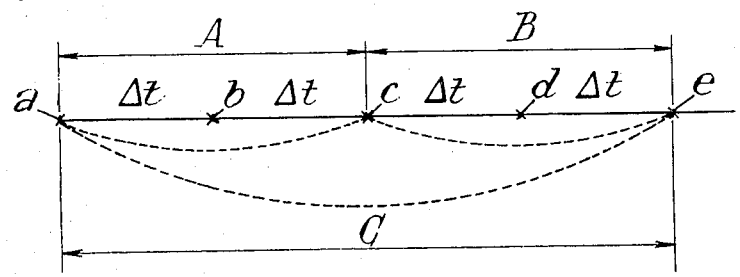
FIGS. 1 and 2 are diagrammatic representations of the means of compression used in the method and the device of the invention.
Figure 2:
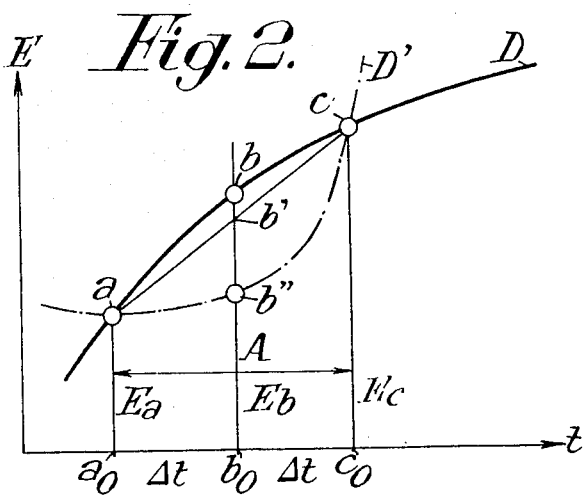

With reference first of all to FIGS. 1 and 2, an explanation will be given as to the compression steps used in the method and device according to the invention.

The aim is to store in memory the smallest quantity of data enabling the reproduction, with an error below a given limit, of the variations of the phenomenon under study. To this effect, the successive data are stored at a variable rate, the rate being greater when the phenomenon evolves rapidly.

According to the invention, a method is used which consists in systematically comparing the mean value of the two outer data of a set of three successive data, separated by two equal time intervals, with the centre data of this set of three. If the difference between this mean value and the centre data is small (in fact smaller than a predetermined limit), the variation is substantially linear for the duration of the set of three data, and the storing of the centre data gives hardly any additional information; if, on the other hand, the deviation between the mean value of the two outer data and the centre data is great (in fact, if it exceeds the aforesaid predetermined limit) there was a rapid variation over the duration of the set of the three data and so it is important to keep the centre data value in memory.

In FIG. 1, two successive sets of three data are represented, namely A with data $a$, $b$, and $c$, and B with data $c$, $d$, and $e$. A first comparison may be made on the set $c, d, e$, and if data $d$ deviates only slightly from the mean of data $c$ and $e$, data $d$ is eliminated. In the same way, in the following comparison on set A, if data $b$ differs only slightly from the mean of data $a$ and $c$, data $b$ is eliminated. There will then remain set $C$, made up of data $a$, $c$ and $e$ (data $d$ and $b$ having been suppressed) and the comparison will be made between the centre data $c$ with the mean value of the outer data $a$ and $e$, data $c$ being kept or not, depending on whether data $c$ is very different or only slightly different from the mean of data $a$ and $e$.

It will be noted that the comparison is made between three successive data $c$, $d$, $e$, or $a$, $b$, $c$, or, finally, $a$, $c$, $e$, with an equal time interval between the first and second data, on the one hand, and the second and third data on the other, of the set of three data on which the comparison is made ($\Delta t$ being the constant time interval between $a$ and $b$, $b$ and $c$, $c$ and $d$, $d$ and $e$).

In FIG. 2 there is an illustration of a curve D (in solid line) representing the phenomenon, the range E being plotted against the time $t$. On this curve D, there are successive data $a$, $b$, $c$, of a set of three data, the two time intervals between data b and a, on the one hand, and the data $c$ and $b$, on the other being equal to the elementary sampling interval $\Delta t$. The mean between the ranges $a_0 a$ and $c_0 c$ of data $a$ and $c$ is $b_0 b'$, close to $b_0 b$, the amplitude of data $b$. It is seen that if $b'$ is close to $b$, the variation between $a$ and $c$ is substantially linear and that consequently the information lost through the suppression of data $b$ is negligible.

On the other hand, if attention is turned to curve D' (chain-dotted line) with the successive data $a$, $b''$ and $c$, with a difference $b' b''$ much greater than the difference $b' b$, it is desirable to store data $b''$, without which there would be a great loss of information, since the variation between the data a and c is far from being linear (the amplitude of the mean $b_0 b'$ is very different from $b_0 b''$, the amplitude of the data $b''$).

Figure 4:
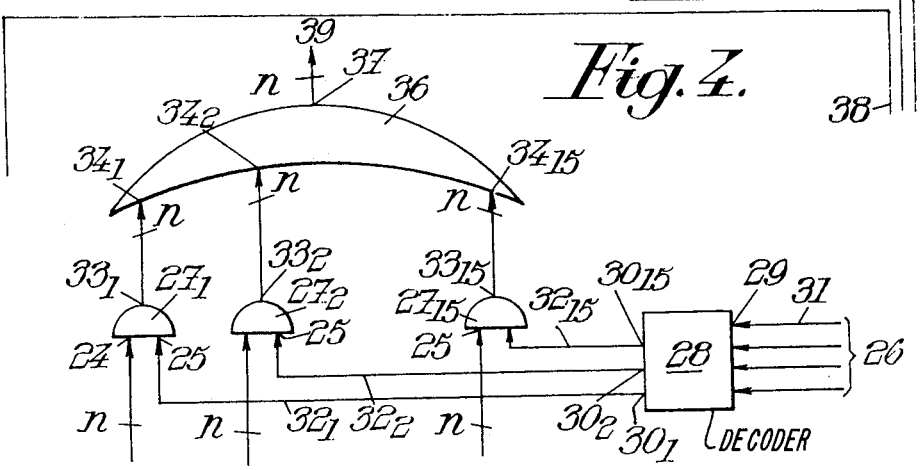
FIG. 4 is a diagrammatic illustration of the switching equipment of the device illustrated in FIG. 3.
Figure 5:
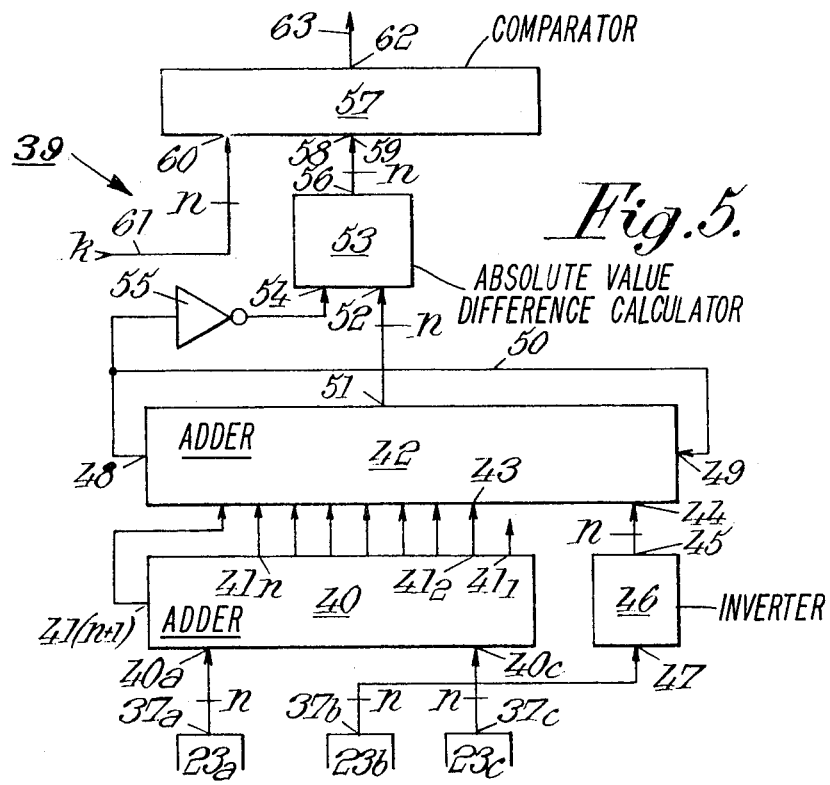
FIG. 5 is a block diagram of the calculator and comparator unit of the device illustrated in FIG. 3.

The process of compression having been explained with reference to FIGS. 1 and 2, there will follow, with reference to FIGS. 3 to 6, a description of the device as set out in the invention using the method also set out in the invention. FIG. 3 is a view of the whole device, whilst FIGS. 4, 5, and 6 illustrate with more detail some of the components in FIG. 3.

With reference now to FIG. 3, it is seen that the device includes first of all an analog-to-digital sampler-converter 1 receiving on its signal input 2, the analog signal $f$ representing the phenomenon under study; the signal $f$ can, for example, be generated by a suitable pick-up delivering an electric signal directly proportional to the amplitude of the phenomenon under study. This converter 1 converts the range of the analog signal f into a number of n bits in the pure binary code, that is to say into a number including n binary digits (only 0s and 1s). In the diagrams all the $n$ conductors designed to transmit a number of $n$ bits are represented by one single conductor crossed by an oblique line with the letter $n$.

The converter 1 also has a control input 3 which receives pulses $g$ from a clock 98 at regular time intervals $\Delta t$, these pulses $g$ causing the sampling, at a constant rate and in digital (binary) form, of the data from the signal $f$. For example, the rate of the pulses $g$ may be $10^6$ cycles per second (one pulse $g$ every microsecond: $\Delta t = 10^{-6}$ second).

To the output 4 of the analog/digital converter 1 is connected a first set of shift registers $5_0$, $5_1$, $5_2$ ... $5_{13}$, $5_{14}$, $5_{15}$, supposing that the first set includes, as in the illustrated device, sixteen registers.

The input $6_0$ of the first register $5_0$ is connected to the output 4 of the converter 1, whilst the input $6_1$, $6_2$, ... $6_{13}$, $6_{14}$, $6_{15}$ of each of the other registers $5_1$ to $5_{15}$ is connected to the output $7_0$ to $7_{14}$ of the preceding register of the set (for example, the input $6_1$ of register $5_1$ is connected to the output $7_0$ of register $5_0$).

Each register $5_0$ to $5_{15}$ of the first set of shift registers also has a control input $8_0$ to $8_{15}$ which is designed to control, in reply to a control pulse $h_0$ to $h_{15}$, the transfer of the data in binary form contained in that register to the following register (on the right) through the connection between the output of 7 of that register and the input 6 of the following register (on the right).

The device includes also a second set of shift registers $9_1$, $9_2$, ... $9_{13}$, $9_{14}$, $9_{15}$, which are intended to store the number of elementary time intervals $\Delta t$ separating the data which are actually in the corresponding registers $5_0$ to $5_{15}$ of the first set.

Upstream of each register $9_1$ to $9_{14}$ is an adder $10_1$, $10_2$, ... $10_{13}$, $10_{14}$, $10_{15}$, which is designed to add one unit each time that its control input $11_1$ to $11_{15}$ is activated by an impulse $i_1$ to $i_{15}$.

Then there is successively, starting from an input 12, which normally receives the number 0: a first adder unit $10_1$, the input $13_1$ of which is connected to the input 12, a first register $9_1$ the input $14_1$ of which is connected to the output $15_1$ of the adder $10_1$, an adder $10_2$ the input $13_2$ of which is connected to the output $16_1$ of the register $9_1$, a register $9_2$ the input $14_2$ of which is connected to the output $15_2$ of the adder $10_2$, and so on until register $9_{15}$, the input $14_{15}$ of which is connected to the output $15_{15}$ of the adder $10_{15}$.

Each register 9 of the second set also has a shift control input $17_1$ to $17_{15}$ which is designed to receive, as are the inputs $8_0$ to $8_{14}$ of the registers $5_0$ to $15_{14}$, the shift pulses $h_0$ to $h_{14}$.

The output $7_{15}$ of the register $5_{15}$ of the first set of registers and the output $16_{15}$ of the register $9_{15}$ of the second set are connected respectively to the data input $18_a$ and to the time interval input $18\ b$ of a memory 18 with two parts $18c$ and $18d$ for data and time intervals respectively; this memory is intended to store the significant data, which are not eliminated in the compression process, and the time intervals separating the successive recorded data, all of which is for later use. The memory 18 also receives shift pulses $h_{15}$ for the recording of data at successive intervals.

Associated with this memory 18 is an address unit 19 which enables a selection, via line 20, to be made of the successive cells of the memory in which the data storing takes place, and, via line 21, the addition of one unit to the address of the address-zeroing-pulses $j$ that can be applied to the input 22 of the unit 19.

The choice of the set of three data, which is submitted to the comparison intended to determine whether or not there is a good case for compression, is made by switching means made up of three multiplexors $23a$, $23b$, $23c$, which have data inputs, such as 24, and a control input $25a$, $25b$, $25c$. There are ($q$-1) inputs 24 for each multiplexer whilst the first set has $q$ gates and the second set has ($q$-1) gates.

In the illustrated embodiment, the multiplexer $23a$ has 15 data inputs 24, the first of which is connected to the output 4 of the converter 1 and the others are connected to the outputs $7_0$ to $7_{13}$ of the registers $5_0$ to $5_{13}$; the fifteen data inputs 24 of the multiplexer $23b$ are connected to the outputs $7_0$ to $7_{14}$ of the registers $5_1$ to $5_{14}$; finally the fifteen inputs 24 of the multiplexer $23c$ are connected respectively to the outputs $7_1$ to $7_{15}$ of the registers $5_1$ to $5_{15}$. It is easily understood that the first item of a set of three data, transmitted by the multiplexer $23a$, cannot be one of the last two data of the registers $5_{14}$ and $5_{15}$ which come before the recording in memory (in $18c$), that the second data of the set of three transmitted by the multiplexer $23b$ can be neither the first data leaving the converter 1, nor the last data leaving the register $5_{15}$ prior to storage, and that finally the multiplexor $23c$ cannot treat as the last data of a set of three the first two data of the converter 1 or of the register $5_0$.

As for the control inputs $25a$, $25b$ and $25c$, they are controlled from an address unit of the multiplexers forming part of the control unit, as described below.

In FIG. 4, there is a more detailed illustration of the structure of a unit such as $23a$, $23b$ or $23c$.

Each of these units has 15 AND gates $27_1$ to $27_{14}$, more generally ($q$-1) gates, with two inputs, one 24 (see also FIG. 3), which receives the data from an output of the type 4 or $7_0$ to $7_{15}$ (FIG. 3), and the other 25, which receives the selection order from a decoder 28 with four inputs 29 and fifteen outputs $30_1$ to $30_{15}$, that is one output per gate $27_1$ to $27_{15}$. This decoder receives on its four inputs 29 the indication of the data to be transmitted, and therefore of the AND gate 27 to actuate in the parallel binary form (the 15 series numbers of the fifteen sets of the three data determined by the seventeen outputs 4, $7_0$, $7_1$, $7_2$, ... $7_{13}$, $7_{14}$, $7_{15}$ can be represented by means of a four bit binary number, given that $2^4 = 16$).

According to the series number arriving at the inputs 29 via four lines 31 from the unit 26, the decoder 28 feeds one, and only one, of its outputs 30, namely the output feeding, via the line $32_1$ to $32_{15}$, the input 25 of the AND gate 27 corresponding to this series number. Only this gate 27, of the fifteen gates $27_1$ to $27_{15}$, has its input 25 fed, and so transmits on its output $33_1$ to $33_{15}$, the signal arriving at the input 24. The outputs $33_1$ to $33_{15}$ are connected to the inputs $34_1$ to $34_{15}$ of an OR gate 36. Consequently the OR gate 36 will transmit, on its output 37, the bit 1 or 0 depending on whether the input 24 of the AND gate 27, the input 25 of which is fed, receives a 1 or 0.

Given that the data comprise n bits, there are really, for each multiplexer 23, $n$ sets of the type illustrated in FIG. 4: in fact each unit illustrated in FIG. 4 is formed by a plug-in card 38 and in this case $n$ cards 38 are required to make up a unit $23a$. It will be the same for units $23b$ and $23c$. Consequently there will be 3n units of the type illustrated in FIG. 4 to make up the set of multiplexors $23a$, $23b$ and $23c$ forming the switching equipment which directs towards a calculator and comparator unit 39, three successive items of data, making up a set of three, from the converter 1 and the registers $5_0$ to $5_{15}$.

The calculator and comparator unit 39 (FIG. 3) is illustrated in detail in FIG. 5 in which may be found first of all the three outputs $37a$, $37b$ and $37c$ of the multiplexers $23a$, $23b$ and $23c$ respectively. $37a$ and $37c$ transmit the two outer data (for example, data $a$ and $c$) of the set of three and $37b$ transmits the centre data (for example data $b$) of the set of three (see FIG. 1 about data $a$, $b$ and $c$).

Unit 39, illustrated in detail in FIG. 5, includes first of all an adder 40, which carries out the addition of the data arriving at its inputs $40a$ and $40c$ from the aforesaid outputs $37a$ and $37c$, it being understood that each of these data has $n$ bits. This sum is normally made up of ($n$+1) bits, namely $n$ bits on the outputs $41_1$ to $41_n$ and one bit on the carry-over output $41(n+1)$. The division by two, to acquire the means of the data coming in $40a$ and $40c$ is performed by suppressing the last bit (the bit with the least weight) normally developed by output $41_1$ which does not deliver its output to any other device. The output of the highest row 41 ($n$+1) delivers the carry figure (if there is one). If the digital values of the amplitudes E$a$ and E$c$ of data $a$ and $c$ (FIG. 2) are called Y$a$ and Y$c$, the adder 40 works out, with the suppression of the bit generated by output $41_1$, (Y$a$ + Y$c$)/2, in other words the arithmetic mean of Y$a$ and Y$c$.

Unit 42 is also an adder which receives, on the one hand on its inputs 43, the bits coming from outputs $41_2$ to $41_{(n^+1)}$ of the adder 40, on other words (Y$a$ + Y$c$)/2, and, on the other hand on its input 44 the n bits from the output 45 of an inverter 46, the input 47 of which is connected to the output $37b$ of the multiplexor $23a$, in other words the digital value Y$b$ of the range E$c$ (FIG. 2) of the data $b$, the output 45 delivering −Y$b$.

The adder 42 works out the addition of (Y$a$ + Y$c$)/2, coming from the unit 40, and −Y$b$, that is the difference between the arithmetic mean of the two outer values Y$a$ and Y$c$ of the set of three and the centre value Y$b$ of the same set.

It will be noted that the carry-over of the adder 42, available on output 48, is sent on to an additional input 49 of this adder: that is a planned contrivance in this particular embodiment, to carry out the inversion and the algebraic sum in units 46 and 42: in unit 46, the inversion by complementation to 1 is carried out, by inverting each bit (the 1s being converted into 0s and the 0s into 1s) by use on to n elementary NOT gates for the n bits of Yb in the unit 46, whilst in unit 42, the algebraic sum, in fact the difference, is worked out by complementation to 2, by adding one bit in case of carry-over, whence the connection via line 50 between the output 48 and the input 49 of the unit 42.

The output 51 of the unit 42 is connected to the first input 52 of a unit 53 which receives at its second input 54 the carry-over generated by output 48 of the unit 42 having passed through an inverter 55. The unit 53 determines the absolute value of the difference $(Ya + Yc)/2 - Yb$ delivered by output 51 of unit 42 due to the following arrangement: the unit 53 has an exclusive OR gate, the output 56 of which is fed only if one input, and only one, 52 or 54 is fed.

It is known that if the input signals $\beta$ and $\beta$ are applied to of an exclusive OR gate the output may be represented by $\alpha\beta + \alpha\beta$. In this particular case, $\beta$ represents for example what is applied on the input 52, i.e. each bit of the aforesaid difference $(Ya + Yc)/2 - Yb$, whilst $\alpha$ represents the sign of that difference arriving at 54. If the sign is positive, it is represented by a 1 at output 48 and by a 0 at 54, after inversion in the inverter 55; the output signal of the unit 53, equal to $\alpha\bar{\beta} + \bar{\alpha}\beta$, will then be $0 + \beta$ (since $\alpha = 0$ and $\bar{\alpha} = 1$): so appearing at 56 there will be $\beta$ which is positive. If, on the other hand, the sign is negative, at the output of 48, there will be the bit 0 and consequently at 54 the bit 1; so at 56 there will be $\alpha\bar{\beta} + \bar{\alpha}\beta = -\beta + 0$ (since $\alpha = 1$ and $\bar{\alpha} = 0$), so the absolute value of $\beta$, since $\beta$ is negative.

So at 56, at the output of unit 53, the absolute value of the difference $(Ya + Yc)/2 - Yb$, that is $(Ya + Yb)/2 - Yb$, is obtained.

Finally, unit 57 is a properly called comparator which receives at 58, via the set of n lines represented in 59, the n bits of the absolute value of the aforesaid difference, and also at 60, via all the n lines 61, the n bits of the limit k which serves to sort out the data to be eliminated: if the difference is smaller, in absolute value, than the limit k, the data in question is eliminated; if this difference is greater, in absolute value, than the limit k, it is kept (depending on the case, there is a choice between keeping or eliminating the centre data if the absolute value of the difference and k are equal).

The output 62 of 57 is fed or not, depending on whether or not there is reason to keep the data Yb in question. The output 62 of the comparator 57 is connected (FIG. 3), through a conductor 63, to the control unit 64 of the summation circuits $10_1$ to $10_{15}$ and also to the shift control unit of the registers $5_0$ to $5_{15}$ as well as $9_1$ to $9_{15}$ under the control of the priority logic unit 66.

With reference to FIG. 6, there will follow a description of the priority logic unit 66 and the control means (control units 64 and 65 and address unit 26 of the multiplexers 23) in FIG. 3. It will be noted that in FIG. 6 there is an illustration of a single cell corresponding to a particular register 9 (there are in fact (q-1) cells of this type).

However, prior to this, a few explanations will be given on the method used, in the priority logic unit 66, to choose the set of three data which will be dealt with in the calculator and comparator unit 39.

The purpose of the priority logic unit 66 is to determine, from among the pairs of equal time intervals between three successive data stored in the registers $5_0$ to $5_{15}$ of the first set or leaving the converter 1, which are those for which these intervals are the biggest, and, in the event of there being simultaneously several pairs of successive equal intervals, which are those which are the furthest to the right, that is to say, closest to memory 18.

To this effect, the difference is determined between the output of each register $9_1$ to $9_{15}$ of the second set and the input of the adder $10_1$ to $10_{15}$ which precedes it, in the subtracter units $67_1$ to $67_{15}$. Owing to the fact that, as explained below, each adder 10 adds one unit in the event of suppression of the data stored in the corresponding register 5, each register 9 encloses the number of elementary intervals $\Delta t$, the data of the corresponding register 5 is shifted in relation to the data in the register 5 immediately to the left. Each unit 67 determines the number of elementary intervals $\Delta t$ between the data of two successive registers 5. The role of the priority logic unit 66 is to compare the number of intervals $\Delta t$ determined by the units 67.

The logic unit 66 (FIG. 6) includes first of all an AND gate 68, the first input 69 of which is connected to the output 70 of the associated subtracter unit 67 and the second input 71 of which is connected to the output 72 of the identical cell of the unit 66 on its right; the cell furthest to the right, the input 70 of which is connected to the output $70_{15}$ of the unit $67_{15}$, receives on its input 71 the initialization bit "1".

The AND gate 68 developes a signal on its output 73 if the two inputs 69 and 71 simultaneously receive a "1".

Each elementary cell of the unit 66 also includes an inverter 74 and a second AND gate 75, the first input 76 of which receives the same signal as the input 71 of the gate 68, since it is connected to the output 72 of the cell immediately to the right, and the second input 77 of which receives the same signal as the input 69 of the gate 68, but after inversion in the inverter 74, since it is connected to the output 70 through said inverter.

The AND gate 75 delivers on its output when its two inputs 76 and 77 simultaneously receive a 1, that is to say when 72 delivers a 1 and 70 a 0. So it is noted that, if the gate 68 delivers, the output 70 delivers a 1, and so 77 receives a 0 and consequently the gate 75 does not deliver on its output 72 (in the diagram it has been supposed that it is the cell of row 13 in question and the two shown outputs 72 have been given the subscripts 13 and 14.)

By to the addition of +1 at each adder $10_1-10_{15}$ there will be in the successive registers $9_1, 9_2, \ldots 9_{13}, 9_{14}, 9_{15}$ bigger and bigger numbers. The successive subtraction units $67_1, 67_2, \ldots 67_{14}, 67_{15}$ determine the differences between these numbers and will show the equal differences between the biggest numbers furthest to the right, and so the set of three data on which the possible compression will have to be carried out.

The output signal of the set of units 67 reaching the logic unit 66 will be a binary number of $(n-1)$ bits, for example (with $n = 16$) 0101001011001100. The cells of the logic unit 66 will receive on their input 69, from the right, first of all 0 s, then a 1 will appear.

In reply to a zero on the input 69 of a cell of the unit 66, its AND gate 68 will not deliver. On the other hand, the AND gate 75 furthest to the right will deliver since its input 76 is initialized to 1: this 1, transmitted through the output 72 of the gate 75 furthest to the right, will be transferred to the following cell on the left and so on to the left as long as there are cells receiving a 0 on their input 69.

On the other hand, when this 1 reaches a cell, the input 69 of which is connected to an output 70 delivering a 1, it will be the AND gate 68 of that cell which will deliver, since its two inputs 69 and 71 receive a 1, whilst the AND gate 75 of this cell will not deliver since its input 77 receives a 0 owing to the fact of inversion in the inverter 69. This 0 will be transferred towards the left all along the cascade of cells of unit 66 since all the inputs 76 of the gates 75 will receive a 0, so the gates 68 of these cells will receive a 0 on their input 71 and will not deliver.

The result is that only one gate 68 delivers, that is the gate of the cell furthest to the right which receives a 1 on its input 69. So, if the number leaving the units 67 by the outputs 70 is, as indicated above 010100101100100, only the underlined 1 will be transferred (by the cell of row 13, that is, the one illustrated), the output 73 of row 13 being the only one fed from among the $(n-1)$ outputs $73_1$ to $73_{15}$. So the priority logic unit will deliver 000000000000100. This corresponds to a same maximum time difference between the three data of a set of three in the registers $5_{11}$, $5_{12}$ and $5_{13}$, the difference having been determined by unit $67_{13}$ between the output of the register $9_{13}$ and the register $9_{12}$.

Still with reference to the FIG. 6, it will now be explained how the indication of selection delivered by the outputs $73_1$ to $73_{15}$ of the logic unit 66 is used in the units 64, 65 and 26 (FIG. 3).

The fifteen outputs 73 of the logic unit 66 are applied to the address unit 26 of the multiplexors 23a, 23b, 23c, which, via the four lines 31, feed the decoder 28 in FIG. 4. So the logic comparator unit 66 controls the addressing in the multiplexors 23a, 23b, and 23c, of the set of three data, delivered by the converter 1 and the registers $5_0$ to $5_{15}$, on which the unit 39 will work out the comparison. In this case, it is the set of data in the registers $5_{11}$, $5_{12}$, $5_{13}$, which is dealt with.

The output 73 of each AND gate 68 also acts to control the units 64 and 64 thanks to the other gates illustrated in FIG. 6, of a cell of units 64 and 65.

Each cell of the shift control unit 65 has an AND gate 78, the first input 79 of which is connected to the output 73 of the AND gate 68 of the same cell and the second input 80 of which receives a signal $m$, via the line 63, of the output 62 of the calculator and comparator unit 39. If the AND gate 78 is fed at the same time at 79 and 80, it delivers on its output 81 a signal $h$ which is sent both to the register 5 and its corresponding register 9. So one AND gate 78 will transmit on its output 81 the shift order of the corresponding registers 5 and 9 if the unit 39 decides that there is good reason to keep the content of the corresponding register 5 (signal $m$ on the input 80), the selection of the registers 5 and 9 depending just on the cell the gate 78 of which receives a 1 from its associated gate 68. A pulse $g$ (FIG. 3) ensures, in the AND gate 95, synchronism with the sampling in the unit 1 which also receives $g$. To this end, the gate 95 receives $h$ on its input 96 and $g$ on its input 97.

To finish the description of the device as set out in the invention, with reference to the lower part of FIG. 6, there follows an explanation of the operation of the summation control unit 64, which controls by the pulses $i_1$ to $i_{15}$ the addition of one unit in the adders $10_1$ to $10_{15}$, in fact in the adder 10 which corresponds to the register 5 whose data was suppressed in the suppression process.

On the suppresion of the centre data of a set of three data, the time interval between the two outer remaining data which are going to occupy two successive registers is modified and this modification must be recorded in a register 9. To this end, line 63 transmits the information as to whether or not the centre data has been suppressed, not only to the shift control unit 65, but also to the summation control unit 64, which has, as illustrated in FIG. 6, three gates, i.e. OR gate 82, NAND gate 83, AND gate 84, in cascade.

The OR gate 82 has two inputs 85 and 86, the first of which receives the output signal of the AND gate 68 and the second of which receives a signal from the cell of the unit 64, immediately to the left (cell of row 12), that is from the output $87_{12}$ of the gate 82 of that cell immediately to its left, the initialization of the input 86 of the cell furthest to the left of the unit 64 being effected at 0. The output $87_{13}$ of the gate 82 of the cell illustrated, not only sends via line 88 the output signal on the input 86 of the cell immediately to the right, but also on the input 89 of the NAND gate 83 which has a second input 90 connected to the line 63 to receive the signal sent through output 62 of the calculator and comparator unit 39.

Finally the AND gate 84 has two inputs 91 and 92; the first 91 is connected to the output 93 of the gate 83 and the second 92 receives the timer signal g which is also applied to the converter 1 and to the unit 65 from the timer 98.

The output 94 of the AND gate 84 delivers the output signal $i$, from the unit 64, which is sent to the control input 11 of the corresponding adder 10.

The unit 64, one cell of which was illustrated in FIG. 6, operates as follows:
Its OR gate 82 transmits a pulse if one of its inputs or both inputs 85, 86, are fed, that is to say if there is a signal on the output of the AND gate 68 and/or if its second input 86 receives a pulse from the cell immediately to the left, that is to say if, by recursion, any OR gate 82 to its left delivers. So the OR gate 82 of the unit 64, the associated AND gate of which delivers and the OR gates 82 which are to the right of an OR gate which delivers, feed their output 87. The corresponding line 88 will then feed the OR gate 82 immediately to its right on the input 86 and, by recursion, the inputs 86 of the OR gates 82 to its right.

Furthermore, the input 89 of the NAND gate 83 is fed. If, at the same time, the input 90 of this gate 83 is also fed from the output 62 of the unit 39 (FIG. 3), the NAND gate 83 will not deliver. This gate will only deliver if either of its two inputs 89 and 90 are not fed, that is to say if the gate 82 of its cell does not deliver (and so if the corresponding gate 68 and the gates 68 further to the left do not deliver), or if the unit 39 has given the order for the suppression of the centre data of the set of three data which it has been considering. In that case, the output 93 will deliver a signal which the gate 84 synchronizes with the time signals g for an output in 94 of the unit 64.

The summation order i available on the output 94 is applied to the corresponding summing circuit 10.

To explain the invention better there will now follow a view of the global operation of the device as shown in FIGS. 3 to 6, using the procedure for compression of data, which was explained with reference to FIGS. 1 and 2.

The analog signal $f$, arising from the phenomenon under study, is sampled by the analog/digital converter 1 at regular intervals determined by the pulses g from the timer 98. The converter 1 transforms the analog signal into a binary number of $n$ bits which move successively from left to right in the cascade or set of registers 5. Proportionately as the successive registers are filled by shift from left to right under the influence of the signal $h$, comparison between the three data of sets of three data chosen by the priority logic unit 66 are worked out in the calculator and comparator unit 39, each set of three data being channelled through the multiplexers 23a, 23b and 23c under control from the address unit 26 of the multiplexers, controlled by unit 66.

If there is no reason for suppressing the centre data of a set of three which has been considered by unit 39, the data all move one row in the registers 5, under the control of pulse h from the unit 66: the data which was in the last register on the right, $5_{15}$, is transferred into part 18c of memory 18, whilst a new data is inscribed in the first register $5_0$ from the converter 1.

At the same time as the unit 65 is ordering the shift of the content of the registers 5 to the right, it is ordering the shift of the content of the registers 9, also to the right; each register 9 encloses the number of elementary time intervals $\Delta t$ separating the data contained in the two corresponding successive registers 5. The number with $p$ digits, which is in the last register $9_{15}$, is recorded in part 18d of memory 18 at the same time as the corresponding data is recorded (from the register $5_{15}$) in the part 18c of memory 18.

On the other hand, if the calculator and comparator unit 39 decides that there is good reason to suppress the centre data of the set of three which it is considering, the shift control unit 65 only orders the shift to the right in the set of registers 5 on the left of the register 5 which contains this centre data to be suppressed, and the same for the corresponding registers 9. In these conditions the data of this register 5 and the number of the corresponding register 9, which are to be suppressed, are not shifted towards the right, and so are automatically erased by the movement of the data and the number which are in the register 5 and the register 9 immediately on their left. In this case, no storing takes place in memory 18 from the registers $5_{15}$ and $9_{15}$, the content of which is not transferred.

The preceding operations of shift to the right of all the registers 5 and 9 with storing in parts 18c and 18d of memory 18, or of shift to the right of only a certain number of registers 5 and 9 (on the left of the register 5 containing the data to be suppressed and of the corresponding register 9) with no recording in memory, are repeated until the phenomenon under study is finished, or unit memory 18 is completely filled. In this last case, arrangements must be planned to stop the device operation, or to switch the device to another memory of the same type as memory 18, or, from time to time, to empty the content of memory 18 into another memory with greater capacity.

It therefore seems that a device according to the invention compared to the other existing devices of the type in question, presents numerous advantages, particularly the following:

The device as set out in the invention does not pose the delicate problem of synchronization, since it is the signal itself which orders the rate of sampling best adapted to its frequency characteristics: the slowly variable part of the phenomenon under study is translated by a small number of data recorded in memory, most of the space in this memory being devoted to the variations of the phenomenon; this occurs automatically without any outside intervention, thereby avoiding any waste of memory space.

It is entirely static and consequently does not involve the drawback of devices which use rotary parts.

The device as set out in the invention respects the signal under study providing a sampling frequency is chosen that is more than double the maximum frequency of the spectrum of the analog signal representing the phenomenon under study.

The device according to the invention can be made entirely automatic.

It is particularly suitable for the quick recording of data in memory, for example in the field of measurement acquisitions.

With a relatively reduced memory, it enables the important information to be stored, eliminating redundant information.

With such a device a multi-track system may be operated, by synchronizing several simple devices of the type described or by planning for the devices of the system a common part at the level of compression of data in the event of correlated phenomena.

The device as set out in the invention may be used in measuring disturbance, that is to say to record transient phenomena, the beginning of the disturbance itself causing the increase in frequency of recordings in memory.

One use to which the device may be put is the monitoring, in a high voltage station, of possible faults of the electricity distribution network; the relevant data when a fault appears are automatically recorded at a very quick sampling rate, so that it is possible to use a memory of reduced capacity.

It can also be used for the recording of transients in the checking of electric transformers and disjunctor units.

Although there has been described the preferred embodiment of this novel invention, many variations and modifications will now be apparent to those skilled in the art. Therefore, this invention is to be limited, not by the specific disclosure herein, but only by the appending claims.

We claim:

1. A method for recording, in real time, non uniformly varying data, with the compression of data during periods of relatively slow variation thereof, characterized by the fact that it comprises, in combination, the following successive operations:
   constant rate sampling of data in digital form;
   storing the sampled data in the form of a series of a predetermined number of successive sampled data;
   comparing a set of three successive data from the series to check if the difference between the centre data of this set of three data and the arithmetic mean of the two extreme data thereof is greater of smaller, in absolute value, to a given limit;
   performing in response to said checking, of one or the other of these two operations: the first, which is carried out if the aforesaid difference is less, in absolute value, to the said limit, consists in suppressing the centre data of the set of three and to increment by one row in the series all the data which come after the suppressed centre data, the second, which is carred out if the difference is greater, in absolute value, to said limit, consists in memorizing the oldest data of the series by incrementing by one row all the stored data of the series of data;

storing a sampled data in the most recent row of storage which has just been vacated by the forward movement of part or all of the data already stored; and simultaneously with the preceding operations of storing, comparing, performing and storing successive data, the successive operations of storing and memorizing the time intervals separating the effectively stored, then memorized data whereby each of the memorized data is identified as to its time occurrence.

2. A device for compressing data and recording the compressed data, characterized by the fact that it comprises, in combination:

a constant rate sampler for data in digital form;

a first cascade set of shift registers, the input of the first register of the set being connected to the output of the sampler, for the storing of sampled data;

a calculator and comparator unit, with three data inputs coupled to respective ones of said registers, designed to differentiate between the signal on its second input and the arithmetic mean of the signals on the first and third inputs and to compare the absolute value of this difference with a limit value applied in the form of a signal on a fourth input;

switching means, the inputs of which are connected to the outputs of the shift registers of the first set and which is designed to switch to their three outputs, which are connected to the three inputs of the comparator unit, three consecutive outputs chosen from among the outputs of the aforesaid registers;

a second cascade set of shift registers, the number of which is equal to the number of registers of the first set less one unit, for recording the time intervals between sampled data stored in the registers of the first set;

adder units to add one unit to the signal appled on its input, connected between the successive registers of the second set of registers as well as upstream the first register of this set;

subtractor units associated with each register of said second set of registers and each adder, for subtracting the value of the input of the adder unit preceding it from the value of the output of the associated register of the second stage set;

a logic unit, the inputs of which are connected to the outputs of the aforesaid subtractor units and which determines the three successive registers of the first stage the outputs of which will be connected through said switching means to the calculator and comparator unit;

a control unit transmitting the decisions of the logic unit to the switching means, the registers of the first and second sets and the adder units; and a storing or memory unit with one part, the input of which is connected to the output of the last register of the first set, and a second part, the input of which is connected to the output of the last register of the second set whereby each sampled data stored therein is identified as to its time occurrence.

3. Device according to claim 2, characterised by the fact that the calculator and comparator unit includes: a first adder with two inputs, which works out of the sum of the signals applied on its first input, which forms the first input of the calculator and comparator unit, and its second input, which forms the third input of the calculator and comparator unit; a second adder which receives, on the one hand, the output of the first adder, except for the lowest order bit, and also has an input which is connected to the second input of the calculator unit through an inverter; an "exclusive OR" circuit which receives, on a first input, the output of the second adder and, on its second input, the sign of the output of the second adder after inversion in an inverter: and a comparator unit which compares the output of the "exclusive OR" circuit with the limit value.

4. Device according to claims 2 characterised by the fact that the switching means are made up of three multiplexers, each with: a decoder, which receives, from the control unit, the indication of the output of the register of the first set, to be sent to the calculator and comparator unit; AND gates, connected in parallel with two inputs, one of which is connected to the output of a register of the first set and the other is connected to an output of the aforesaid decoder: and an OR circuit, each input of which is connected to an output of the aforesaid AND gates.

5. Device according to claims 4 characterised by the fact that the logic unit has, for each register of the second set, a cell with a first AND gate, a first input of which is connected to the output of the corresponding subtractor unit, and the second input of which is connected to the logic unit cell downstream; and a second AND gate, the first input of which is also connected, through an inverter, to the output of the aforesaid corresponding subtracter unit.

6. Device according to claims 5, characterised by the fact that the control unit comprises an address unit for the switching means, a shift control unit and a summation control unit, the address unit being fed from the logic unit to select the switching means, the shift control unit being connected to the control inputs of the shift registers of the first and second sets and the summation control unit operating the adder units so that they may add one unit.

7. Device according to claims 6 characterised by the fact that the address unit is a coder, the outputs of which are connected to the inputs of the corresponding decoder of the multiplexers, whilst its inputs are connected to the outputs of the first AND gates of the logic unit.

8. Device according to claim 6 characterised by the fact that the shift control unit has, for each register of the second set, a cell with a first AND gate, a first input of which is connected to the output of the first AND gate of the logic unit associated with the same register of the second set whereas a second input is connected to the output of the calculator and comparator unit, and a second AND gate, the first input of which is connected to the output of the first AND gate of that shift control unit cell and a second input of which receives synchronization pulses.

9. Device according to claim 6, characterised by the fact that the summation control unit has, for each register of the second set, a cell with an OR gate, the first input of which receives the output of the first AND gate of the cell of the logic unit associated with the same register of the second set, and a second input which receives the output of the cell of the summation control unit placed upstream; a NAND gate, a first input of which is connected to the output of the OR gate of the same cell of the summation control unit and a second input connected to the output of the calculator and comparator unit and an AND gate, the first input of which is connected to the output of the aforesaid NAND gate, and the second input of which receives synchronization pulses.

* * * * *